United States Patent
Pedrotti et al.

(10) Patent No.: US 10,378,921 B2
(45) Date of Patent: Aug. 13, 2019

(54) METHOD AND APPARATUS FOR CORRECTING MAGNETIC TRACKING ERROR WITH INERTIAL MEASUREMENT

(71) Applicant: Sixense Entertainment, Inc., Los Gatos, CA (US)

(72) Inventors: Owen Walter Pedrotti, Daly City, CA (US); Oded Y. Zur, Kochav-Yair (IL)

(73) Assignee: Sixense Enterprises Inc., Los Gatos, CA (US)

(*) Notice: Subject to any disclaimer, the term of this patent is extended or adjusted under 35 U.S.C. 154(b) by 232 days.

(21) Appl. No.: 14/797,983

(22) Filed: Jul. 13, 2015

(65) Prior Publication Data

US 2016/0377451 A1   Dec. 29, 2016

Related U.S. Application Data

(60) Provisional application No. 62/023,750, filed on Jul. 11, 2014.

(51) Int. Cl.
   *G01C 25/00*   (2006.01)
   *G01R 33/00*   (2006.01)
   *G01V 7/00*    (2006.01)

(52) U.S. Cl.
   CPC ......... *G01C 25/00* (2013.01); *G01R 33/0023* (2013.01); *G01V 7/00* (2013.01)

(58) Field of Classification Search
   CPC ..................... G01C 25/00; G01R 33/0023
   USPC .......................................... 73/1.75
   See application file for complete search history.

(56) References Cited

U.S. PATENT DOCUMENTS

| | | | | |
|---|---|---|---|---|
| 4,737,794 A * | 4/1988 | Jones | ............... | F41G 3/225 342/386 |
| 5,953,683 A * | 9/1999 | Hansen | ............... | G01C 17/30 324/207.17 |
| 6,249,745 B1 * | 6/2001 | Hsu | ............... | G01C 21/16 701/504 |
| 6,513,381 B2 * | 2/2003 | Fyfe | ............... | A63B 69/0028 702/160 |
| 7,451,549 B1 * | 11/2008 | Sodhi | ............... | G01C 17/38 33/356 |
| 7,533,569 B2 * | 5/2009 | Sheynblat | ............... | G01P 15/18 73/509 |
| 8,515,707 B2 * | 8/2013 | Joseph | ............... | G01C 21/165 702/141 |
| 8,825,435 B2 * | 9/2014 | Smid | ............... | G01C 21/165 702/141 |

(Continued)

*Primary Examiner* — Peter J Macchiarolo
*Assistant Examiner* — Alexander A Mercado
(74) *Attorney, Agent, or Firm* — Gard & Kaslow LLP

(57) ABSTRACT

A method and apparatus is disclosed for synchronizing a magnetic field transmitter and receiver to resolve phase ambiguity so that phase information for the position and orientation of the receiver may be derived and maintained. A synchronization process allows for the phase information to be initially derived based upon known information from other sources, and then tracked from one measurement to the next. In another embodiment, information from an inertial measurement unit (IMU) is used to determine the phase information or to correct for errors in the determination from receiver data of the position and orientation of a receiver, and prevent such errors from accumulating as the receiver moves away from a transmitter.

6 Claims, 7 Drawing Sheets

(56) References Cited

U.S. PATENT DOCUMENTS

| | | | | |
|---|---|---|---|---|
| 8,907,893 B2* | 12/2014 | Shaw | .................... | G06F 3/0346 345/156 |
| 8,957,812 B1* | 2/2015 | Hill | ..................... | G01S 5/0027 342/445 |
| 9,068,843 B1* | 6/2015 | Sohn | ........................ | G06F 3/03 |
| 2003/0045816 A1* | 3/2003 | Foxlin | ................. | G01C 21/165 600/595 |
| 2004/0073360 A1* | 4/2004 | Foxlin | ................. | G01C 25/005 701/517 |
| 2011/0153250 A1* | 6/2011 | Bailey | ................... | G01C 17/38 702/94 |
| 2011/0260968 A1* | 10/2011 | Ye | ........................ | G06F 3/0346 345/158 |
| 2012/0259579 A1* | 10/2012 | Blake | ................... | E21B 47/024 702/151 |
| 2016/0047675 A1* | 2/2016 | Tanenhaus | ........... | G01C 25/005 702/104 |
| 2017/0160086 A1* | 6/2017 | Kesaniemi | ............ | G01C 17/28 |

\* cited by examiner

METHOD AND APPARATUS FOR CORRECTING MAGNETIC TRACKING ERROR WITH INERTIAL MEASUREMENT

This application claims priority to Provisional Application No. 62/023,750, filed Jul. 11, 2014, which is incorporated by reference herein in its entirety.

FIELD OF THE INVENTION

The present invention relates generally to magnetic tracking devices, and more particularly to error correction for such devices.

BACKGROUND OF THE INVENTION

Alternating current (AC) magnetic tracking systems typically use a method in which magnetic fields are generated and measured using a system of orthogonal coils to generate position and orientation information which is used by a computer system. One common application is tracking a user for the purpose of playing a video game or being immersed in a virtual reality world.

In some prior art embodiments, a transmitter has three orthogonal coils which generate the magnetic field signal, and may be located in a fixed position, such as in a local base station, video game console or other apparatus. A receiver in a tracking device similarly has three orthogonal magnetic field sensing coils, and provides information about the sensed magnetic field to a processor, which derives the position and orientation of the tracking device relative to the base station from such information.

There are a number of factors that limit the accuracy of such magnetic tracking systems. The strength of the magnetic field between a tracking device and a base station transmitter suffers from attenuation over distance, which decreases accuracy in the detection of the magnetic field by the tracker. Objects located between the tracking device and the base station may cause distortion in the magnetic field, particularly if those objects contain ferrous materials. Conducting surfaces in the environment may also contain eddy currents induced by the generated magnetic field which in turn generate secondary magnetic fields that interfere with the ability of sensors to detect the source magnetic field.

Another factor is that errors in detection of the magnetic field by a receiver which cause the position and orientation of the receiver to be incorrectly determined are typically larger the farther away the receiver is from the transmitter. Further, the error may not be linear, i.e., the error may increase faster than the distance between the receiver and the transmitter.

Still another source of ambiguity in wireless magnetic tracking systems is the magnetic field signal phases that are received by the sensor. In wired tracking systems, a synchronization ("sync") signal between the transmitter and receiver indicates the phases of the magnetic field signals and enables the receiver to extract the relative signs of the signals. (In some cases another means may be used to pass this information.) The signs indicate the orientation and direction of the magnetic field (i.e. positive or negative in direction and its orientation).

In a wireless system, when there is no sync signal between the receiver and transmitter, there is an ambiguity with respect to the signal's signs and thus also with respect to the position and orientation of the receiver relative to the transmitter. When the phase of the transmitted signal is unknown, the sign of the received signals is ambiguous, which can create an additional uncertainty in the location of the receiver with respect to its direction from the transmitter.

Changes in the magnetic field, error in the determination of the magnetic field and phase ambiguity all contribute to inaccurate determination of the position and orientation of a receiver relative to a transmitter in a magnetic tracking system.

SUMMARY OF THE INVENTION

A system and method is disclosed which allows for determination of the phase relationship between a transmitter and receiver in a magnetic tracking system, and for correction of errors due to variations in the magnetic field and to incorrect detection of the magnetic field by the receiver.

One embodiment discloses a method of using an inertial measurement unit (IMU) to correct for error in a measured position vector and orientation of a tracking device containing a receiver in a magnetic tracking system having a transmitter, comprising: receiving at a processor a gravity vector and position vector as measured by the receiver; determining by the processor a true gravity vector from information from the IMU; computing by the processor an angle of geodesic rotation between a gravity vector as measured by the receiver and the true gravity vector as a rotation error quaternion; performing by the processor a spherical interpolation to reduce the angle of geodesic rotation by half to form a position correction quaternion; rotating by the processor the measured position vector about an origin of the tracking space using the position correction quaternion to produce a corrected position vector indicating the true position of the receiver relative to the transmitter; and directly composing by the processor the rotation error quaternion with the measured orientation to produce a corrected orientation of the receiver relative to the transmitter.

Another embodiment discloses a non-transitory computer readable storage medium having embodied thereon instructions for causing a computing device to execute a method of using an inertial measurement unit (IMU) to correct for error in a measured position vector and orientation of a tracking device containing a receiver in a magnetic tracking system having a transmitter, the method comprising: receiving at a processor a gravity vector and position vector as measured by the receiver; determining by the processor a true gravity vector from information from the IMU; computing by the processor an angle of geodesic rotation between a gravity vector as measured by the receiver and the true gravity vector as a rotation error quaternion; performing by the processor a spherical interpolation to reduce the angle of geodesic rotation by half to form a position correction quaternion; rotating by the processor the measured position vector about an origin of the tracking space using the position correction quaternion to produce a corrected position vector indicating the true position of the receiver relative to the transmitter; and directly composing by the processor the rotation error quaternion with the measured orientation to produce a corrected orientation of the receiver relative to the transmitter.

DETAILED DESCRIPTION OF THE INVENTION

Figure 1:
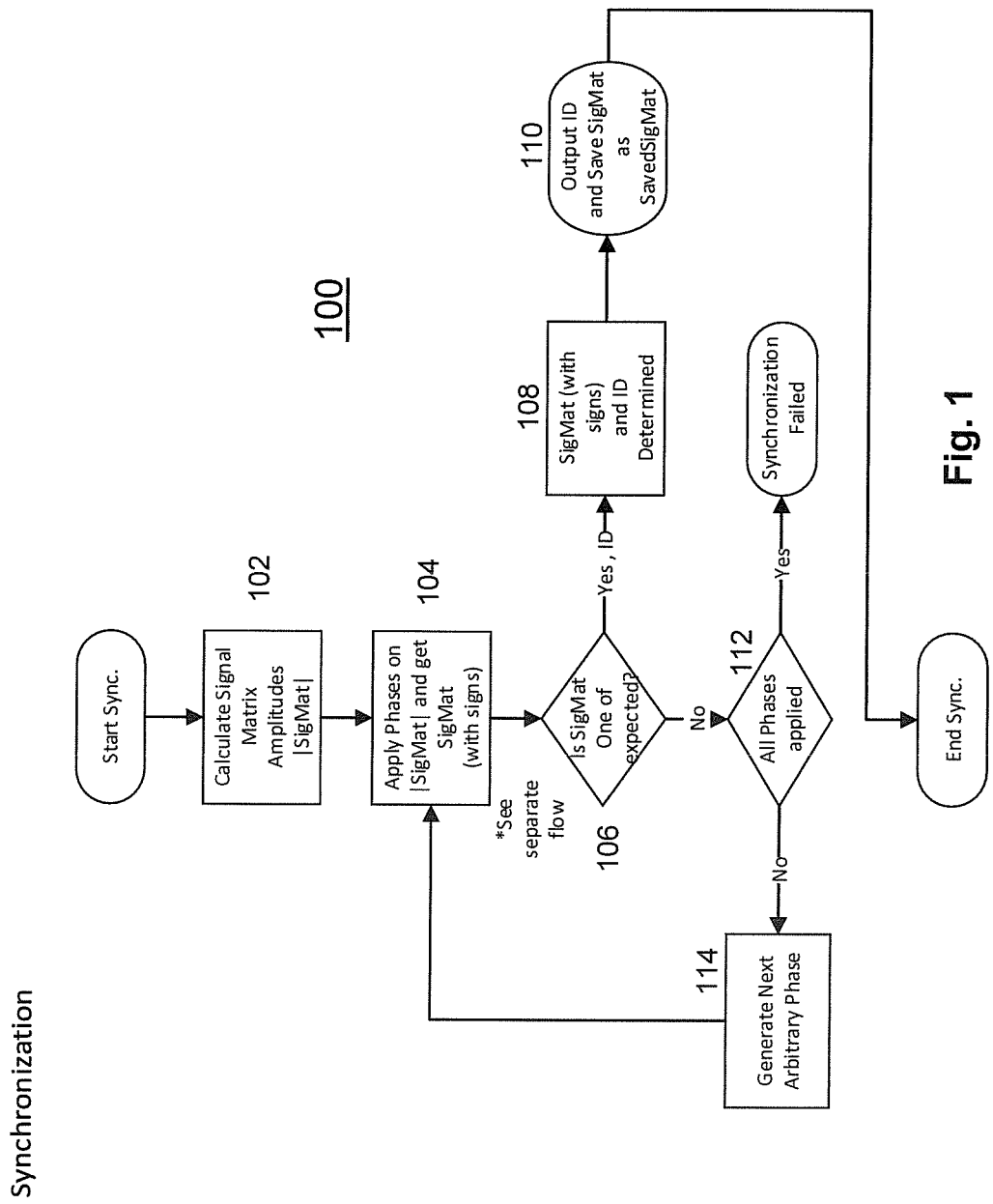
FIG. 1 is a flowchart of a startup synchronization process for a magnetic tracking system in one embodiment.

In one embodiment, a method and apparatus is disclosed for synchronizing a magnetic field transmitter and receiver to resolve phase ambiguity so that phase information for the position and orientation of the receiver may be derived and maintained. A synchronization process allows for the phase information to be initially derived based upon known information from other sources. The phase information may then be tracked and updated, assuming that there is correlation between the signals from the receiver from one measurement to the next.

In another embodiment, the synchronization process includes the use of information from an inertial measurement unit (IMU) to determine the phase information. An IMU is an electronic device that is commonly used to measure and report the velocity, orientation and gravitational forces on a device or craft, using a combination of accelerometers and gyroscopes, and sometimes even magnetometers.

In still another embodiment, information from an IMU may be used to correct for errors in the determination from receiver data of the position and orientation of a receiver, and prevent such errors from increasing as the receiver moves away from a transmitter.

As above, AC magnetic trackers, and the processors which determine the position and orientation of such trackers, are well known to those of skill in the art. One such example, U.S. Pat. No. 4,737,794 ("the '794 patent"), teaches a "method and apparatus for determining remote object orientation and position with an electromagnetic coupling." It shows a transmitter comprising a plurality of radiating antennas, located at a source to provide a plurality of magnetic fields spanning three dimensional space and defining a source reference coordinate frame, and a receiver comprising a plurality of receiving antennas located on an object to be tracked for receiving that field. A processor receives the outputs from the receiving antennas and converts the received components of the transmitted magnetic fields into remote object position and orientation relative to the source reference coordinate frame. The antennas may be, for example, dipole antennas, loop antennas, or coil antennas.

In such a system having three transmitter antennas, a receiver generates a signal that is a 3×3 signal matrix, called "SigMat" herein, which represents a total of nine measures of the three transmitted magnetic fields; each column corresponds to the sensed field from a separate one of the three coils of the transmitter, and each row corresponds to a separate one of the three coils of the receiver. One example of a 3×3 matrix that might represent SigMat is:

$$\begin{matrix} a11 & a12 & a13 \\ a21 & a22 & a23 \\ a31 & a32 & a33 \end{matrix}$$

where a11 through a33 represent the nine measures of the three magnetic fields, one measure of each magnetic field by each of the three receiver coils.

It is the evaluation of SigMat that results in a determination of the position of the receiver. However, as noted in the '794 patent, the sign of the position is ambiguous, which means that there is a hemispherical ambiguity that cannot be resolved without further information, since due to the physics of magnetic fields a second receiver displaced 180 degrees about the origin from a first receiver will produce the same SigMat.

In order to resolve this phase ambiguity, a startup synchronization process is used in which the phase information is derived by placing the receiver at one of several known locations and orientations, and comparing the possible values of SigMat at that location to expected values of SigMat to find the best match.

FIG. 1 is a flowchart of a first portion 100 of a startup synchronization process between a transmitter and a receiver according to one embodiment. It is assumed that there is a plurality of locations for each of which an accurate SigMat has previously been determined, including all phase signs. These are called "expected" SigMats, as the synchronization process tries to determine whether the receiver is initially in one of these known locations.

At step 102, SigMat is determined by a receiver in response to a magnetic field as above, and the amplitude of SigMat, which is the distance of the receiver from the transmitter, is calculated by a processor. The amplitude of SigMat is represented as |SigMat| herein.

Next, at step 104, a possible phase for each of the three dimensions is applied to |SigMat|. Since there are three dimensions, and each dimension may have a positive or negative phase (i.e., be in either direction from the transmitter), there are eight ($2^3$) possible phase combinations, and thus eight possible values of SigMat; these eight possible values are referred to as SigMat(n) where n=1 to 8.

A possible phase combination is applied to the received SigMat to create a SigMat(n) by multiplying each of the columns of SigMat by either a 1 or a −1. Thus, all eight possible SigMats may be determined by multiplying the columns of the received SigMat by all eight possible three-digit combinations of 1 and −1

Thus, a first Sigmat, SigMat(1), may be created by multiplying each column by 1:

$$\begin{matrix} a11^*1 & a12^*1 & a13^*1 \\ a21^*1 & a22^*1 & a23^*1 \\ a31^*1 & a32^*1 & a33^*1 \end{matrix}$$

A second Sigmat, SigMat(2), may be created by multiplying the last column by −1:

$$\begin{array}{ccc} a11^*1 & a12^*1 & a13^*(-1) \\ a21^*1 & a22^*1 & a23^*(-1) \\ a31^*1 & a32^*1 & a33^*(-1) \end{array}$$

a third Sigmat, SigMat(3), by similarly multiplying the middle column by −1, and a fourth Sigmat, SigMat(4), by multiplying the first column by −1. Three additional Sig-Mats, SigMat(5), SigMat(6) and SigMat(7) are similarly created by multiplying two of the three columns by −1, and multiplying the third column, different in each case, by 1.

Finally, the last SigMat, SigMat(8) is created by multiplying each column by −1:

$$\begin{array}{ccc} a11^*(-1) & a12^*(-1) & a13^*(-1) \\ a21^*(-1) & a22^*(-1) & a23^*(-1) \\ a31^*(-1) & a32^*(-1) & a33^*(-1) \end{array}$$

It is at Step 104 that one of these eight possible phase combinations, and thus one of the eight possible values of SigMat(n), is selected, and the phases of that SigMat(n) applied to |SigMat|.

At step 106 it is determined whether this selected SigMat is one of the expected values of SigMat previously determined from a known location. This step is explained in more detail below.

If the current SigMat(n) is one of the expected values of SigMat, at step 108 the currently selected SigMat(n) is saved as the current value of SigMat, and thus the phases of SigMat are determined and the position of the receiver is determined with no ambiguity. At step 110, this value of SigMat is saved as SavedSigMat for further use as explained below, and the synchronization process ends.

If at step 106 the current SigMat(n) is not one of the expected values of SigMat, then at step 112 it is determined whether all possible phase combinations of SigMat(n) have been applied to SigMat.

If not all phase combinations have been applied, then at step 114 another of the possible phase combinations is selected, and the process returns to step 104 to apply that phase combination to |SigMat| to determine a new SigMat (n), and the process then again proceeds to step 106 to see if the new SigMat(n) is one of the expected SigMats.

This cycle will continue until either one of the values of SigMat(n) results in a match with an expected SigMat at step 106, or it is determined at step 112 that all phase have been applied with no match. If no match can be found, then the synchronization process has failed and must either be repeated or some alternative way found to determine the phases of SigMat.

Figure 2:
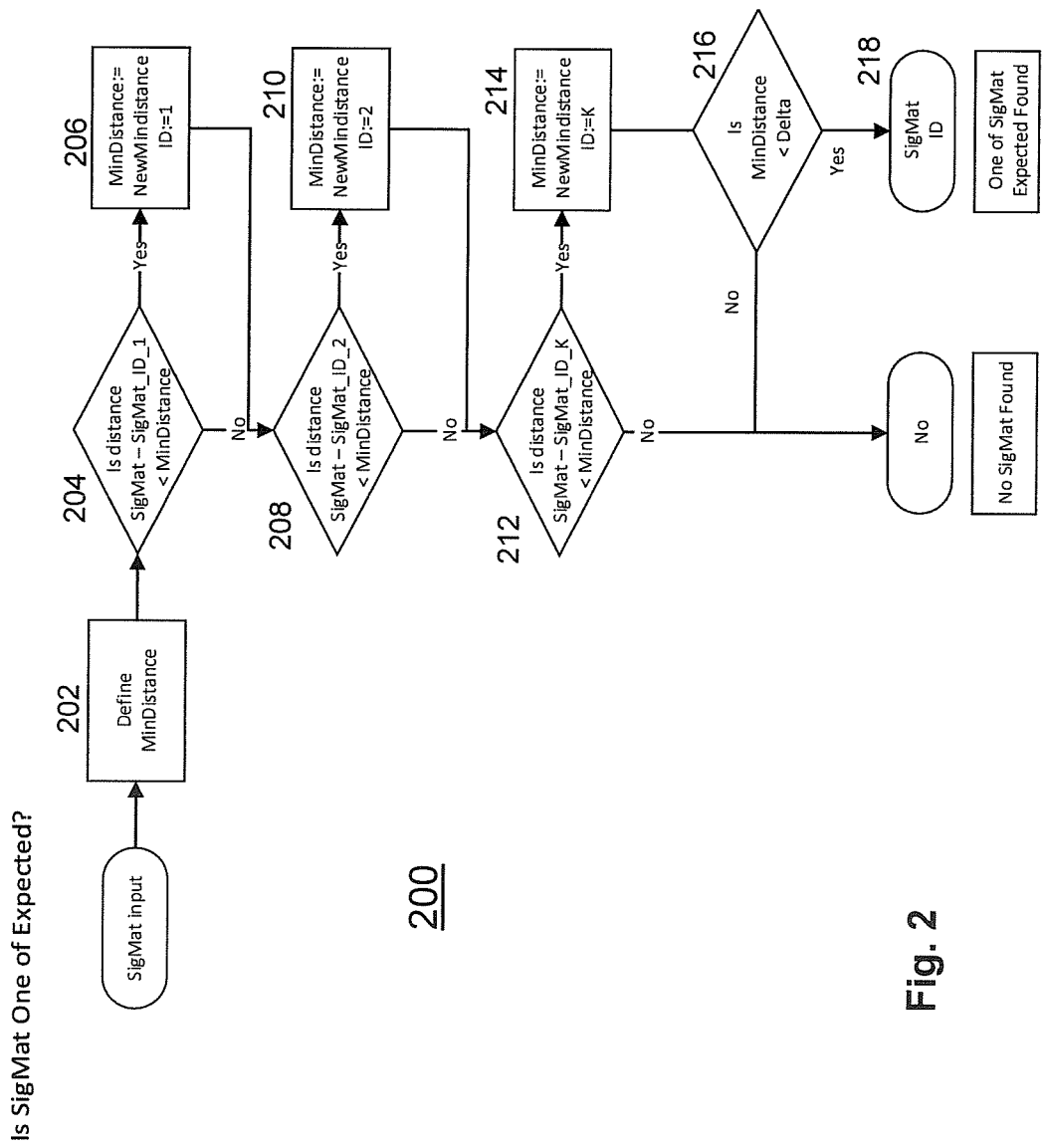
FIG. 2 is a flowchart of a process for determining a closest known location to a receiver in a synchronization process for a magnetic tracking system in one embodiment.

Returning to step 106 of FIG. 1, one way in which it may be determined whether a particular SigMat(n) is one of the expected SigMats is shown by process 200 in FIG. 2. In this process, it is assumed that there are a number k of known locations, and that the known SigMat for each location 1 to k is given by SigMat_ID_k. In some embodiments, receivers may be located in, for example, video game controllers, and the known locations may be docking stations configured to hold the controllers. However, one of skill in the art will recognize that any location may be defined as a known location as long as a SigMat_ID_k can be identified for that location, and a receiver can be placed accurately at that location.

At step 202 a minimum distance MinDistance is defined. The significance of MinDistance will be explained below.

At step 204, the value of SigMat(n) from step 104, i.e., a SigMat from a receiver having one of the n possible sets of phases, is compared to SigMat_ID_1, i.e., the SigMat from a first known location. Since SigMat(n) represents the location of the receiver (given the phase assumptions), and SigMat_ID_1 the first known location, the distance between the receiver and the first known location can be determined. A processor determines if this distance is less than the first selected value of MinDistance.

If the determined distance between SigMat(n) and Sig-Mat_ID_1 is less than the pre-defined MinDistance, than at step 206 the determined distance becomes the new value of MinDistance, and an identifier ID is set to 1 to indicate this. If the determined distance is not less than the pre-defined MinDistance, then the value of MinDistance is not changed.

In either case, the process continues to step 208, where the value of SigMat(n) is now compared to the value SigMa-t_ID_2, i.e., the SigMat from a second known location, and again a processor determines the distance between them to see whether it is less than MinDistance, whether MinDistance is the pre-defined minimum distance or a lesser distance between SigMat(n) and SigMat_ID_1.

If the distance between SigMat(n) and SigMat_ID_2 is less than MinDistance, the distance between SigMat(n) and SigMat_ID_2 is set as the new value of MinDistance, and ID is set to 2.

The process repeats to compare SigMat(n) to each Sig-Mat_ID_k, i.e., the SigMat for each known location, as shown by step 212, and MinDistance is reset to a new distance each time the distance between SigMat(n) and any SigMat_ID_k is smaller than the then-current value of MinDistance as shown at step 214. In this way, the processor compares SigMat(n) to the SigMat for each location and determines which known location is the closest, as long as one of the known locations is within the original value of MinDistance set in step 202.

If after steps 204, 208 and 212 the distances between SigMat(n) and all known locations have been considered and none of the known locations are within the defined MinDistance of SigMat(n), then the processor determines that no expected SigMat can be found and returns to process 100 to determine whether there is another SigMat(n) to be considered.

If SigMat(n) is within the original MinDistance of any of the known locations, at step 216 the value of MinDistance is compared to a value Delta. If MinDistance is less than Delta, the processor determines that an expected SigMat, i.e., a match for the closest known location, has been found, and sets the phases of SigMat to those of the SigMat(n) for which MinDistance is less than Delta.

This process will thus result in finding the appropriate phases of SigMat as long as Delta is set as a small enough value to reasonably guarantee that SigMat in fact matches one of the known locations. If the known locations are far enough apart, for example, it will be apparent to one of skill in the art how to set the value of Delta to guarantee that only known location can be matched. Of course, the original value of MinDistance should never be less than Delta; as will be obvious, this would result in any SigMat(n) being acceptable as the actual value of SigMat and the process would not properly determine the phases to be applied.

If no value of MinDistance for the value of SigMat(n) is less than Delta, then process 200 will indicate that no SigMat is found and the process returns to step 106 of FIG. 1, indicating that SigMat(n) is not one of the expected values. Process 100 of FIG. 1 will then generate a new SigMat(n) and continue, passing the new SigMat(n) to process 200 for the same steps described above.

This process will repeat for each value of SigMat(n) that is generated by step 104 of FIG. 1 to find the smallest distance between the receiver, given the choice of phases, and a known location until a match is found. Thus, the process will find the best match for SigMat to an expected location, at least within the set of possible phases SigMat(n) that has thus far been considered.

It is possible that not all possible values of SigMat(n) will be considered if a match is found before all values are considered. Again, if the value of Delta is small enough, or the known locations far enough apart, if MinDistance is less than Delta it should be clear that a known location has been matched.

There are several possible options when synchronization fails. One option is to have the synchronization process restart and repeat until it is successful. Another option is to select one of the known locations as the expected SigMat, for example, the one that the process determines is the minimum distance from any value of SigMat(n) even if it does not meet the other criteria above. In such a case, there may be some indication that synchronization has not been successful and that the result may not be reliable. Still another option is to indicate to the user that synchronization has failed and that the user should try a different method, for example placing the receiver directly at one of the known locations and repeating the synchronization process.

In an alternative embodiment, process 200, which as above determines whether there is an expected SigMat for a known location (identified by a SigMat_ID_k) that matches a SigMat(n) from the receiver, can also include another step in which the distance between the receiver and the closest known location is compared to the distances between the receiver and all of the other known locations. In such an alternative embodiment, the calculations from steps 204, 208 and 212 of the distances from the receiver to each known location are saved.

Once the closest known location has been identified as above, the processor calculates the ratio of the distance to the closest known location (i.e., the updated value of MinDistance) to the distances to each other known location. The processor may be configured to determine that an expected SigMat, i.e., a known location matching the receiver location, has been found only if MinDistance, the distance from the receiver to the nearest known location, is significantly less than the distance to any other known location. For example, in one embodiment the processor may find an expected SigMat only if the distance to the second closest known location is at least five times the final value of MinDistance.

Figure 3:
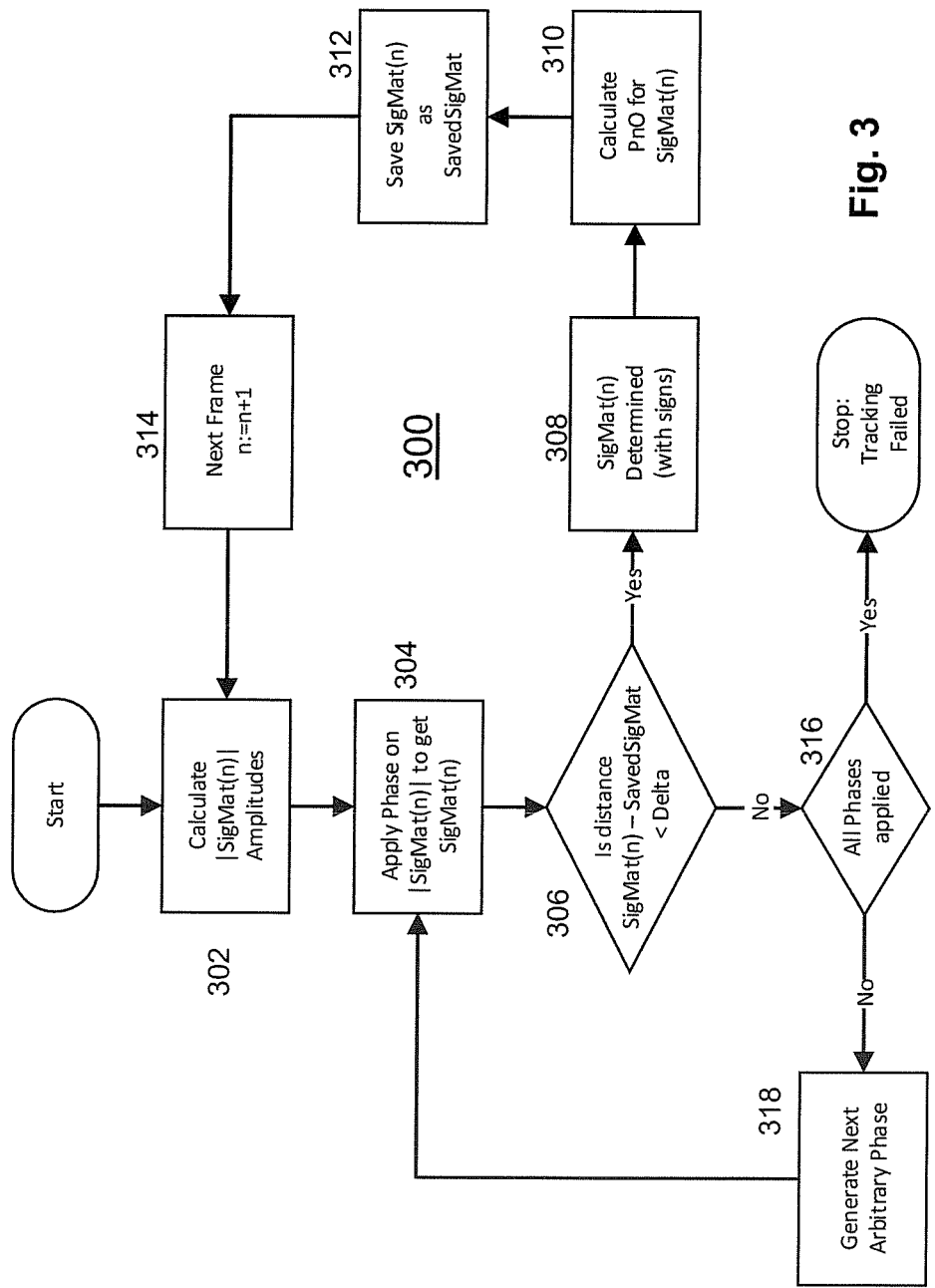
FIG. 3 is a flowchart of a run-mode synchronization process for a magnetic tracking system in one embodiment.

Once startup synchronization has been completed, and assuming a match to an expected SigMat has been found and phases assigned to the SigMat from the receiver, the system can switch to a running mode as shown by process 300 in FIG. 3. As above, there is value of SigMat resulting from the synchronization process that has been saved as SavedSigMat.

In the running mode, a new signal is obtained at specified time intervals, sometimes called "frames." When each such new signal is obtained, at step 302, the processor first generates a |SigMat|, i.e., the amplitude of SigMat without phases as described above.

At step 304, the processor applies a possible phase combination to SigMat to get a first SigMat(n), similar to step 104 of process 100 in FIG. 1.

At step 306, the distance between SigMat(n) and SavedSigMat is compared and it the processor determines whether the distance between them is less than a value Delta. (This Delta may or may not be the same as the Delta in step 216 of process 200 in FIG. 2.)

The running mode, and the value of Delta here, is based upon the assumption that from signal to signal the change in position and orientation has a physical limitation, and thus cannot change faster than a particular speed. Delta is chosen to represent the maximum distance that it is expected the receiver can travel during the signal interval.

If at step 306 the processor determines that the distance between SigMat(n) and SavedSigMat is less than the distance Delta, it is assumed that the phases of SigMat(n) are correct, and that SigMat(n) represents the new position of the receiver. Thus, at step 308, the processor determines that SigMat(n) is the new value of SigMat.

At step 310, the processor calculates the new position and orientation of the receiver based upon SigMat(n), and at step 312 the value of SigMat(n) becomes the new value of SavedSigMat for the purpose of synchronizing the next signal. At step 314 the process proceeds to the next signal interval (or frame) and the above steps repeat.

If at step 306 the processor determines that the distance between SigMat(n) and SavedSigMat is greater than the maximum expected change in position Delta, it is assumed that the phases of the selected SigMat(n) are incorrect. At step 316 the processor checks to see if all possible phase combinations have been applied to |SigMat| and, if not, a different phase combination is selected at step 318, similarly to steps 114 and 116 of process 100 in FIG. 1.

The process then returns to step 304 and the newly chosen phase combination SigMat(n) is applied to |SigMat|, and the process then proceeds to step 306 again to determine whether the new value of SigMat(n) is within distance Delta of SavedSigMat.

The process will continue to track the motion of the receiver as long as at each signal interval a SigMat(n) can be found that corresponds to the receiver moving less than the maximum travel distance Delta. If at step 316 the processor determines that all possible phase combinations have been applied to |SigMat| and no SigMat(n) results in a distance change of less than Delta, then it is assumed that tracking has failed and the process stops.

In an alternative embodiment the process will continue to track the receiver using the SigMat(n) within the smallest distance of SavedSigMat, regardless of whether the difference is less than Delta. However, stopping the process when the difference is greater than Delta improves reliability of the tracking process. If tracking is continued, again an indication may be provided to the user that the result may not be reliable.

In some embodiments information from an IMU may be used either for synchronization of a transmitter and receiver to determine the phases of SigMat. In other embodiments, information from an IMU may be used for error correction to more accurately determine the position of the receiver.

In one such embodiment, startup synchronization may be performed by obtaining the necessary phase information with information from an IMU. An IMU can provide orientation information from a gyroscope, and motion information, at least over short periods of time, by integration of information from an accelerometer. This information can be used to resolve the ambiguity in the phase information, allowing for correct determination of the position of the receiver.

This is done either by correlating an estimated change in position with the magnetic tracking data over the same period to select the position solution that best matches the change in position from the magnetic tracking, or by estimating acceleration from the change in position and comparing the estimate with the measured acceleration from the accelerometer.

Figure 4:
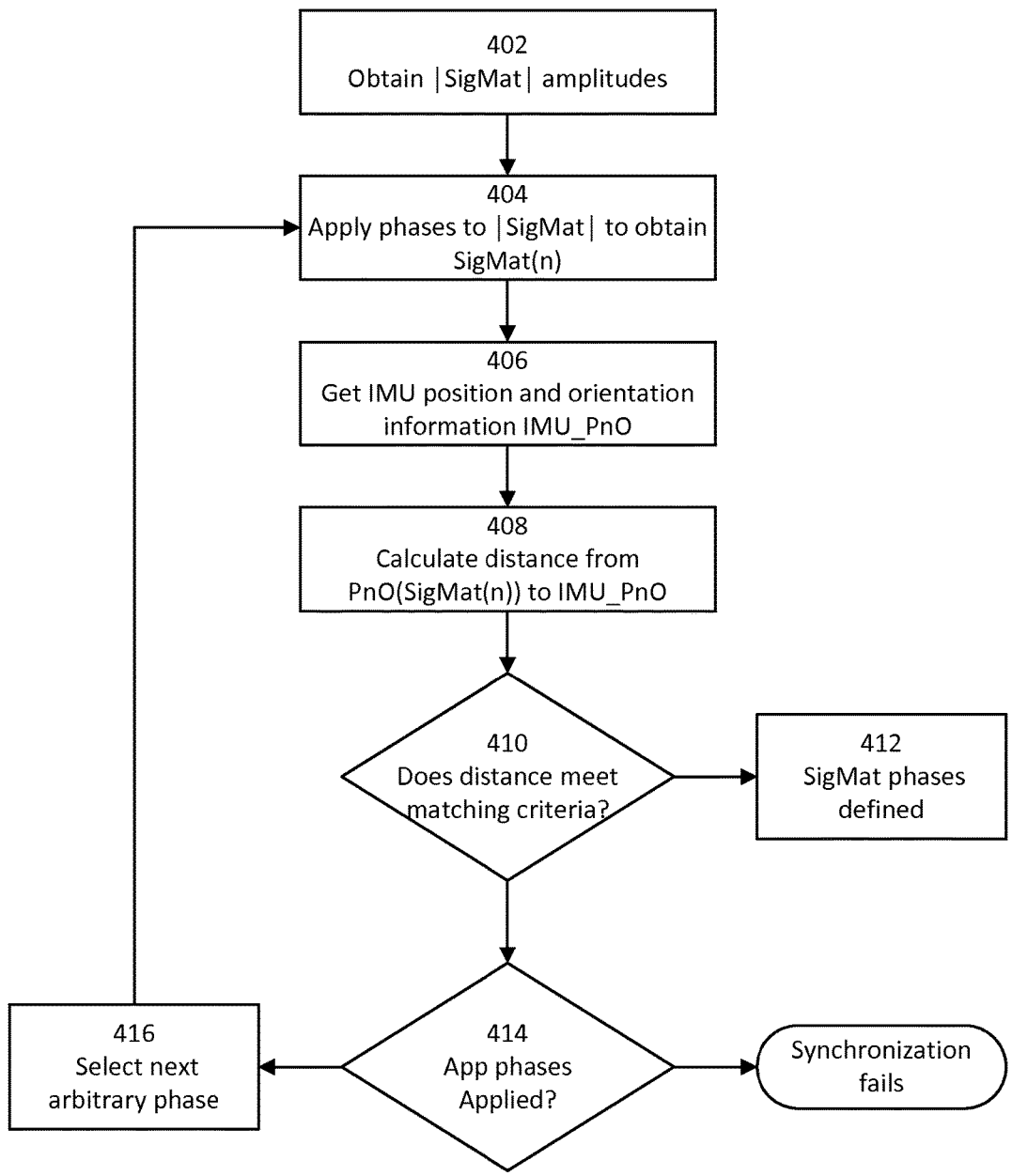
FIG. 4 is a flowchart of a startup synchronization process for a magnetic tracking system in another embodiment.

As in the process of FIG. 1 above, in this embodiment it is similarly necessary to determine which SigMat(n) out of the eight possible phase combinations is the one which correctly describes the location of the receiver. FIG. 4 shows a process 400 for doing this with the use of an inertial sensor.

As in process 100 of FIG. 1, in step 402, the value of |SigMat| is obtained from the receiver, without phases as described above. At step 404, one of the eight possible combinations of phases is assigned to obtain a SigMat(n), which is then converted into the position and orientation that corresponds to SigMat(n); this position and orientation is designated at PnO(SigMat(n)).

At step 406, position and orientation information is obtained from an IMU. This information is designated IMU_PnO herein.

At step 408, the distance between PnO(SigMat(n)) and IMU_PnO is calculated by a processor. At step 410, the processor determines whether the calculated distance satisfies a preselected matching criteria. If so, the phases of SigMat(n) are assumed to be correct and applied to |SigMat| at step 412.

If the calculated distance between PnO(SigMat(n)) and IMU_PnO does not meet the criteria, at step 414 the processor determines if all possible phase combinations have been tried. If not, at step 416 a new phase combination is selected and the process returns to step 404 and steps 404 to 414 are repeated.

If at step 414 the processor determines that all phase combinations have been tried and no SigMat(n) meets the matching criteria, then the process fails.

There are various matching criteria that may be used. In some embodiments, the algorithm applied by the processor may use only part of the information from the IMU, for example, use only the orientation information and ignore the position information.

In other embodiments it will be desirable to use signals from multiple frames, i.e., separate time intervals t1 and t2, and base the matching criteria on comparing changes in the position and orientation information between PnO(SigMat (t1) and PnO(SigMat(t2)) and IMU_PnO values. The change in position and orientation can be used to estimate angular velocity and linear acceleration, which can be directly compared to the output of the IMU. Alternatively, the acceleration obtained from the IMU information can be compared with that obtained by differentiating the magnetic tracking information, although attempting to compute position and orientation from the IMU information is expected to be more computationally complex and less reliable.

In another embodiment, it is possible to correct errors in the reported position of the receiver using information from an IMU.

As above, a magnetic field generated by a transmitter may suffer from distortion due to items in the vicinity of the transmitter and/or the receiver. The magnetic field will curve around conductive materials in the area, and thus the field as sensed by the receiver may not yield a correct determination of the position and orientation of the receiver. Further, as one of skill in the art will appreciate, position and orientation are directly linked, and an error in one will lead to and/or increase error in the other.

Figure 5:
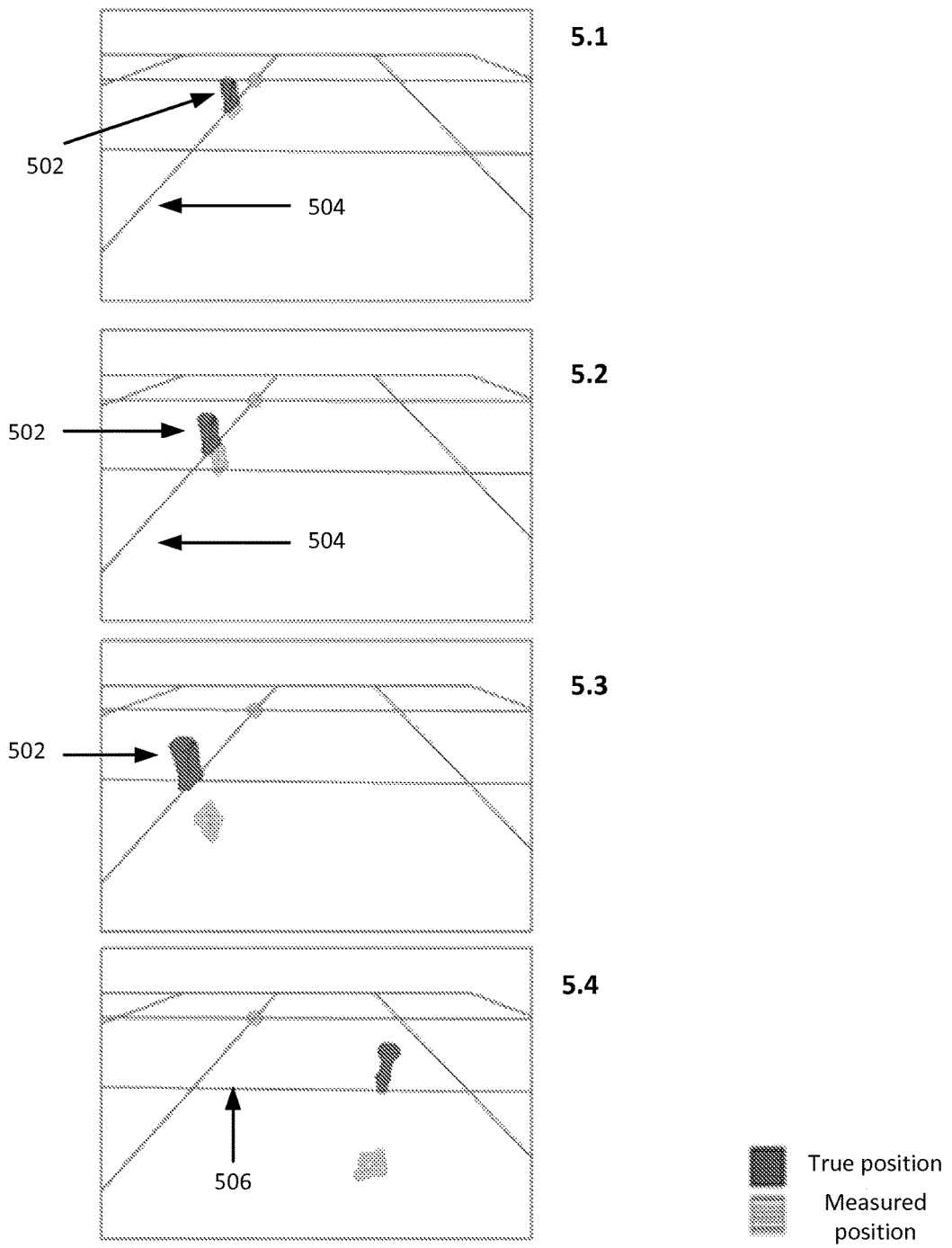
FIG. 5 is an illustration of the accumulation of error in the determination of the position of a receiver as it moves away from a transmitter.

FIG. 5 shows one possible example of the effect of distortion of the magnetic field on the position of a receiver in a magnetic tracking system. In part 5.1 of FIG. 5, a receiver 502 is moved along an axis 504, as if moving toward the viewer of FIG. 5 from an origin point 506. In parts 5.2 and 5.3 of FIG. 5, the receiver has continued to move away from origin point 506. While the receiver remains on axis 504, the measured position of the receiver, based upon the SigMat provided by the receiver, deviates further from axis 504 as the receiver gets further from origin point 506.

In part 5.4 of FIG. 5, the receiver has moved along a second axis 508 which is perpendicular to axis 504, and now appears to have moved sideways with respect to the viewer, i.e., "across the page." The measured position of the receiver continues to show a rapidly increasing error as the receiver moves further from origin point 506.

Figure 6:
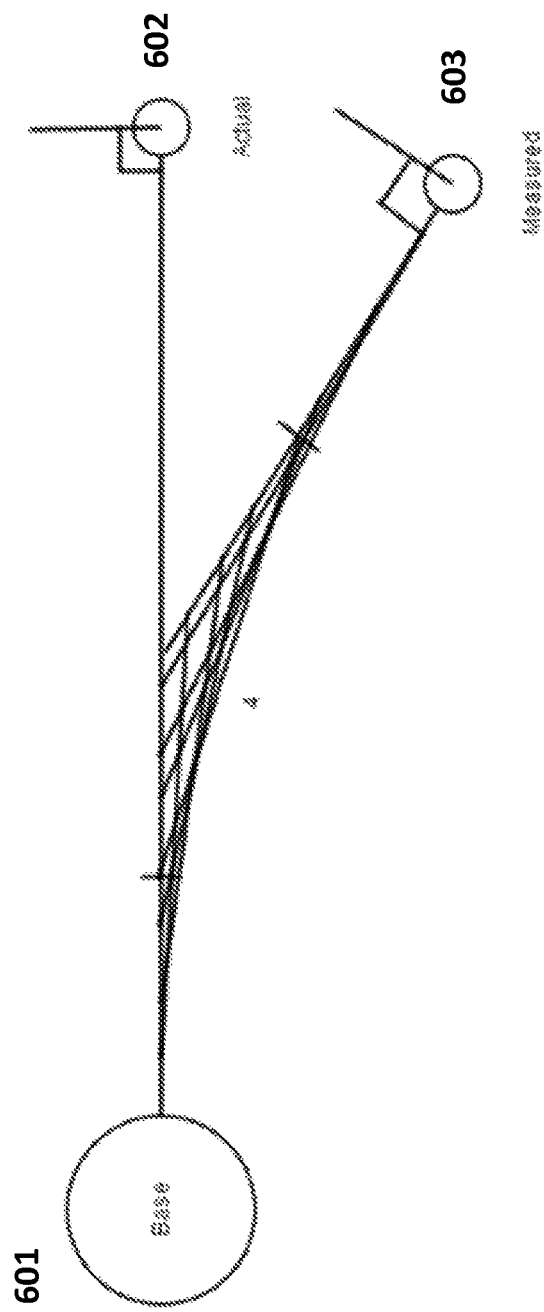
FIG. 6 is another illustration of the accumulation of error in the determination of the position of a receiver as it moves away from a transmitter.

FIG. 6 shows another example of this. A transmitter is located at a base station at position 601. The receiver's actual position is at position 602. However, the receiver's measured position 603 is in a direction that is at an angle from the actual direction from the transmitter. The deviation of the measured position, and the measured direction, from the actual direction increases as the receiver moves away from the transmitter.

Those of skill in the art will be familiar with the concept of pitch, roll and yaw, rotation around the lateral, longitudinal and vertical axes respectively. Measuring the orientation error of a receiver signal is possible in pitch and roll by measuring the direction of gravity from the receiver. Again, an IMU typically has a gyroscope and accelerometer which allows for quick and accurate determination of the true vertical axis of the receiver. This is then compared with the vertical axis as determined by the magnetic tracking system to determine a measurement of the rotation offset. This offset is defined as the geodesic rotation between the two measured axes, equivalent to a "great circle" path on a globe.

Applying this offset directly to the measured orientation of the receiver produces an absolute rotation that is exactly accurate in pitch and roll. (Yaw cannot be corrected exactly because it is not possible to measure absolutely using an inertial tracker such as an IMU, as explained further below.) Position correction may then be performed using a mathematical model of the field distortion.

Since a perfect solution would require a perfect measurement of the magnetic field at all points, in order to obtain a simple model of the field certain assumptions may be made regarding common causes of environmental distortion in magnetic tracking systems. Given such assumptions, correction of errors in pitch and roll may be performed using information from the IMU.

Thus, it is first assumed that the distortion is not highly variable in the space between the magnetic tracking module and the transmitter, so that it is not necessary to take measurements from additional points in space between the transmitter and the receiver to produce an estimate of the receiver's actual location.

Another such assumption is that the largest sources of distortion are above or below the user. A common use case for magnetic tracking systems is in virtual reality systems or video game systems. In such cases a user typically either holds controllers containing receivers and/or wears receivers that are attached to the user's body. There will generally be a certain amount of open space around the user to avoid collisions with objects in the environment during use of the system. Thus, a user will typically need be away from walls or other obstacles, some of which may contain conductive materials. In most cases the nearest source of distortion is thus likely to be in the floor or ceiling, or possibly in a table or desk upon which the transmitter is placed during use of the system.

Empirical testing has shown that greatly improved position data in highly distorted environments can be obtained by treating the field as a curve that begins flat at the location of the transmitter and becomes steeper with distance, as seen in FIG. 6. This has proven to be a good model for the behavior of magnetic fields in the presence of flooring and tables that contain steel structural elements, which are commonly considered a "worst case" for environmental distortion for magnetic tracking systems.

Figure 7:
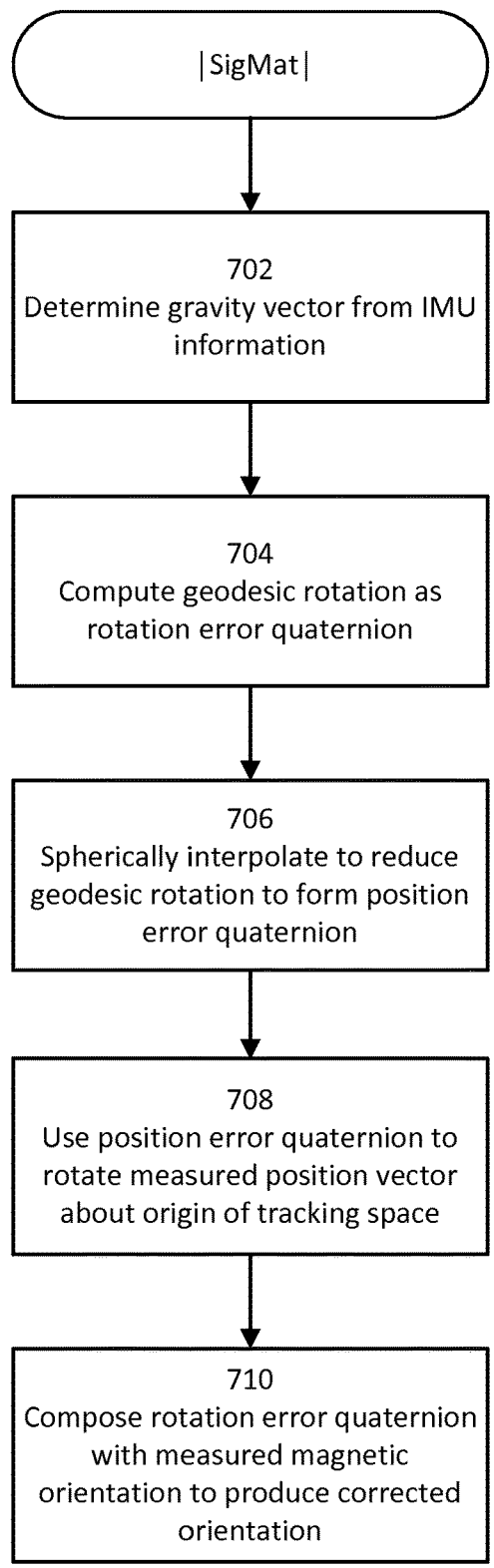
FIG. 7 is a flowchart of an error correction process for the position and orientation of a receiver using information from an inertial measurement unit in one embodiment.

FIG. 7 is a flowchart of one embodiment of a method of correction of the error in position due to orientation error in the receiver. The method relies on the pitch and roll of the transmitter being known, so that there is an absolute vertical axis for the magnetic tracking space. In some embodiments, the location containing the transmitter, such as a base station, may contain its own IMU for this purpose. In other embodiments, such as virtual reality or video game systems, a controller containing an IMU may be physically docked into the base station before use, allowing the IMU in the controller to measure the pitch and roll of the transmitter while it is docked. In still other embodiments a user may be required to level the transmitter by some other means.

As a first approximation, a linear solution may be applied by rotating the position vector about the origin by half the angle of the measured orientation error.

The processor has the value of SigMat previously determined as above, which includes the potentially erroneous position and orientation information, as well as the information from the IMU. At step 702, the processor first determines the gravity vector, i.e., the true direction of "down" from the IMU information.

Next, at step 704, the processor computes the geodesic rotation between the gravity vector as measured by the receiver and the absolute down vector in the magnetic tracking space as a rotation error quaternion. Quaternions are a well known mathematical notation for representing orientation and rotation of objects in three dimensions, and will be well familiar to one of skill in the art.

At step 706 the processor performs a spherical interpolation to reduce the angle of geodesic rotation by half to form a position correction quaternion.

At step 708 the processor uses the position correction quaternion to rotate the measured position vector about the origin of the tracking space.

Finally, at step 710 the rotation error quaternion is directly composed with the magnetic orientation measured by the receiver to produce a corrected orientation.

This linear approach has shown to be accurate at short range, but parabolic curves more closely match observed data and a field's theoretical physical behavior, and it thus expected that quadratic curves may perform better at greater range. A quadratic curve would also provide a useful predictive model in case the inertial sensors cannot provide stable data at the desired frequency.

A quadratic curve model could be implemented by determining a function for a paraboloid with a gradient that matches the measured angle error. This paraboloid function would then be subtracted from the measured position to produce a corrected position. Once a paraboloid is computed it may be reused to estimate the necessary correction at different points on the curve without repeating the function determination for every magnetic position sample. Other curves may provide even better performance-to-accuracy tradeoffs, but more complex functions will require more computation and thus may increase latency in the system beyond desired limits.

Inertial tracking of orientation has certain limitations, a primary one being that measurements have radial symmetry around the gravity vector so that is not possible to determine an absolute orientation along a horizontal plane. For this reason, some IMU's also contain a magnetometer to locate magnetic north and correct for drift in the yaw axis. However, like a generated magnetic field, the earth's magnetic field suffers from the same distortion due to ferrous materials, and so as above the described method does not account for distortion in the yaw axis or the associated distortion of position along the lateral axis. In principle, this yaw distortion can be approximated by examining the gradient of the field distortion in pitch and roll as measured by the IMU.

In an environment with no yaw distortion, i.e., a theoretical room with infinite planes of conductive material above and below the tracking device, the expected distortion of pitch and roll has radial symmetry along the vertical axis, increasing outward in a perfect circle. The two-dimensional gradient of this field distortion (equivalent to the slope of the correction curve) will thus always point directly toward or away from the transmitter. By introducing a source of yaw distortion, such as a conductive vertical pillar, the symmetry will be broken and perturbations will appear in the gradient of the field distortion. Therefore, any deviation of the field distortion gradient from the direction of the field emitter indicates the presence of yaw distortion.

Such a deviation of the field distortion gradient thus yields a magnitude and direction which can theoretically be used as inputs to a more complex model of field distortion than the one given above to correct for yaw error using only inertial measurements, if pitch and roll distortion is also present in the environment and sufficiently large to produce a stable gradient.

Another limitation is that scale error due to conductive materials located behind the transmitter, directly opposite from the receiver, creates a distortion which cannot be accounted for using inertial tracking. This manifests as a uniform scaling of the measured position that increases with both proximity of the receiver to the transmitter and proximity of the conductor to the transmitter. Such distortion cannot be detected using inertial sensors because it only affects measured position, not orientation or direction of motion.

Correcting for this scale error distortion would require an additional absolute position sensor, such as an optical camera and marker. However, because the scale distortion varies only by transmitter and distortion source distance from the emitter, this additional measurement does not need to be performed for all magnetic tracking devices in a given environment. By correcting for the position error of a single receiver using an optical or other positioning system, a function can be derived that will correct the positions of any number of receivers that are under the influence of the scale distortion source.

One example of this would be to use an optical tracking system included with a head-mounted display in conjunction with a receiver also attached to the head. By comparing these two different sensors the scale correction function which could be derived, and then be applied to other receivers on the hands or other parts of the body that either do not have optical tracking markers or are not within view of the camera. As this correction function will not change unless the transmitter or distortion source have been moved, in a static environment it can continue to be used to provide stable correction even during periods where all optical tracking has failed, such as if the camera is occluded or the head-mounted display leaves its field of view.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above. It will also be apparent that in some instances the order of steps described herein may be altered without changing the result of performance of all of the described steps.

There may be a single processor, or multiple processors performing different functions of the functions described herein. One of skill in the art will appreciate how to determine which and how many processors will be appropriate for a specific intended application, and where in a given system they might be located.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. It may be possible to incorporate the described methods into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of using an inertial measurement unit (IMU) to correct for error in a measured position vector and orientation of a tracking device containing a receiver in a magnetic tracking system having a transmitter and displaying the tracking device corresponding to an actual position and corrected orientation of the receiver, comprising:

displaying on a display the tracking device based on a measured position and orientation of the receiver relative to the transmitter;

receiving at a processor a gravity vector and position vector as measured by the receiver;

determining by the processor a true gravity vector from information from the IMU;

computing by the processor an angle of geodesic rotation between a gravity vector as measured by the receiver and the true gravity vector as a rotation error quaternion;

performing by the processor a spherical interpolation to reduce the angle of geodesic rotation by half to form a position correction quaternion;

rotating by the processor the measured position vector about an origin of the tracking space using the position correction quaternion to produce a corrected position vector indicating the actual position of the receiver relative to the transmitter; and determining by the processor a corrected orientation of the receiver relative to the transmitter based upon the rotation error quaternion and the measured orientation; and displaying on the display the tracking device in the actual position and corrected orientation of the receiver relative to the transmitter.

2. A non-transitory computer readable storage medium having embodied thereon instructions for causing a computing device to execute a method of using an inertial measurement unit (IMU) to correct for error in a measured position vector and orientation of a tracking device containing a receiver in a magnetic tracking system having a transmitter and displaying the tracking device corresponding to an actual position and corrected orientation of the receiver, the method comprising:

generating instructions to display on a display device the tracking device based on a measured position and orientation of the receiver relative to the transmitter;

receiving a gravity vector and position vector as measured by the receiver;

determining a true gravity vector from information from the IMU;

computing an angle of geodesic rotation between a gravity vector as measured by the receiver and the true gravity vector as a rotation error quaternion;

performing a spherical interpolation to reduce the angle of geodesic rotation by half to form a position correction quaternion;

rotating the measured position vector about an origin of the tracking space using the position correction quaternion to produce a corrected position vector indicating the actual position of the receiver relative to the transmitter;

determining a corrected orientation of the receiver relative to the transmitter based upon the rotation error quaternion and the measured orientation; and generating instructions to display on a display device the tracking device in the actual position and corrected orientation of the receiver relative to the transmitter.

3. A system for using an inertial measurement unit (IMU) to correct for error in a measured position vector and orientation of a tracking device containing a receiver in a magnetic tracking system having a transmitter and displaying the tracking device corresponding to an actual position and corrected orientation of the receiver, comprising:

a transmitter comprising a plurality of source magnetic coils each configured to generate a magnetic field;

a tracking device comprising an inertial measurement unit (IMU) and a receiver, the receiver comprising a plurality of sensor magnetic coils configured to sense the magnetic fields and to generate a signal matrix representing the position and orientation of the receiver relative to the transmitter;

a processor configured to:

provide instructions to a display device to display the tracking device based on a measured position and orientation of the receiver relative to the transmitter;

receive a gravity vector and position vector as measured by the receiver;

determine a true gravity vector from information from the IMU;

compute an angle of geodesic rotation between a gravity vector as measured by the receiver and the true gravity vector as a rotation error quaternion;

perform a spherical interpolation to reduce the angle of geodesic rotation by half to form a position correction quaternion;

rotate the measured position vector about an origin of the tracking space using the position correction quaternion to produce a corrected position vector indicating the actual position of the receiver relative to the transmitter;

determine a corrected orientation of the receiver relative to the transmitter based upon the rotation error quaternion and the measured orientation; and provide instructions to the display device to display the tracking device in the actual position and corrected orientation of the receiver relative to the transmitter.

4. The method of claim 1 wherein rotating by the processor the measured position vector about an origin of the tracking space using the position correction quaternion is determined by a suitable curve fitting function.

5. The non-transitory computer readable storage medium of claim 2 wherein rotating the measured position vector about an origin of the tracking space using the position correction quaternion is determined by a suitable curve fitting function.

6. The system of claim 3 wherein the processor configured to rotate the measured position vector about an origin of the tracking space using the position correction quaternion is configured to be determined by a suitable curve fitting function.

\* \* \* \* \*